US011600341B2

(12) United States Patent
Iijima (10) Patent No.: US 11,600,341 B2
(45) Date of Patent: Mar. 7, 2023

(54) SEMICONDUCTOR INTEGRATED CIRCUIT, MEMORY CONTROLLER, AND MEMORY SYSTEM (71) Applicant: Kioxia Corporation, Tokyo (JP)

(72) Inventor: Hiroaki Iijima, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/688,167

(22) Filed: Mar. 7, 2022

(65) Prior Publication Data

US 2022/0189562 A1 Jun. 16, 2022

Related U.S. Application Data (63) Continuation of application No. 17/020,304, filed on Sep. 14, 2020, now Pat. No. 11,302,402.

(30) Foreign Application Priority Data

Mar. 19, 2020 (JP) .............................. JP2020-050020

(51) Int. Cl.
*G11C 16/32* (2006.01)
*G11C 16/04* (2006.01)
*G11C 16/10* (2006.01)
*G06F 3/06* (2006.01)
*G11C 16/26* (2006.01)

(52) U.S. Cl.
CPC ............ *G11C 16/32* (2013.01); *G06F 3/0604* (2013.01); *G06F 3/0659* (2013.01); *G06F 3/0673* (2013.01); *G11C 16/0483* (2013.01); *G11C 16/10* (2013.01); *G11C 16/26* (2013.01)

(58) Field of Classification Search
CPC ..... G11C 16/32; G11C 16/0483; G11C 16/10; G11C 16/26; G11C 7/22; G11C 7/1057; G11C 7/1084; G06F 3/0604; G06F 3/0659; G06F 3/0673
See application file for complete search history.

(56) References Cited

U.S. PATENT DOCUMENTS

| 6,529,993 | B1 | 3/2003 | Rogers et al. | |
|---|---|---|---|---|
| 9,054,675 | B2 | 6/2015 | Mazumder | |
| 10,580,467 | B2 * | 3/2020 | Iijima | G11C 7/1096 |
| 11,158,359 | B2 * | 10/2021 | Kim | G11C 7/1066 |
| 2012/0146409 | A1 | 6/2012 | Sato | |
| 2019/0287585 | A1 | 9/2019 | Iijima | |

FOREIGN PATENT DOCUMENTS

| JP | 2002-182974 A | 6/2002 |
|---|---|---|
| JP | 2012-123881 A | 6/2012 |
| JP | 2019-160238 A | 9/2019 |

* cited by examiner

Primary Examiner — Xiaochun L Chen
(74) Attorney, Agent, or Firm — Oblon, McClelland, Maier & Neustadt, L.L.P.

(57) ABSTRACT

A semiconductor integrated circuit includes: a first circuit, a second circuit, a third circuit, and a first switch circuit. The first circuit is configured to output a first signal. The second circuit is configured to output a second signal different from the first signal. The third circuit is configured to output a third signal corresponding to either the first signal or the second signal. The first switch circuit is configured to output the third signal to the first circuit in a case that the first circuit outputs the first signal. The first switch circuit is configured to output the third signal to the second circuit in a case that the second circuit outputs the second signal.

20 Claims, 8 Drawing Sheets

SEMICONDUCTOR INTEGRATED CIRCUIT, MEMORY CONTROLLER, AND MEMORY SYSTEM

CROSS-REFERENCE TO RELATED APPLICATION

This application is a continuation of U.S. application Ser. No. 17/020,304 filed Sep. 14, 2020, and which is based upon and claims the benefit of priority from Japanese Patent Application No. 2020-050020, filed Mar. 19, 2020; the entire contents of each of which are incorporated herein by reference.

FIELD

Embodiments described herein relate generally to a semiconductor integrated circuit, a memory controller, and a memory system.

BACKGROUND

A semiconductor integrated circuit capable of adjusting a duty ratio of a strobe signal to be output is known. The duty ratio is a ratio between a period in which a first signal level continues and a period in which a second signal level continues. The semiconductor integrated circuit may be expected to be further downsized.

DETAILED DESCRIPTION

According to one embodiment, a semiconductor integrated circuit includes a first circuit, a second circuit, a third circuit, and a switch circuit. The second circuit is different from the first circuit. The third circuit is configured to adjust a timing of an edge of a signal. The switch circuit is configured to connect the third circuit to the first circuit in a case where a first signal is output from the first circuit to an outside of the semiconductor integrated circuit. The switch circuit is configured to connect the third circuit to the second circuit in a case where a second signal is output from the second circuit to the outside, the second signal being different from the first signal.

Hereinafter, a semiconductor integrated circuit, a memory controller, and a memory system according to an embodiment will be described with reference to the drawings. In the following description, constituents having the same or similar functions are designated by the same reference numerals. Duplicate descriptions of those constituents may be omitted. In the embodiment, "based on XX" means "based at least on XX" and may include a case of being based on one or more elements in addition to XX. Further, "based on XX" is not limited to a case in which XX is used directly, and may include a case in which XX has been calculated or processed before XX is used. "XX" is an arbitrary element (for example, arbitrary information). Even if it is simply described as "connection", it is not limited to a mechanical connection and may include an electrical connection. That is, the "connection" is not limited to a case of being directly connected to an object, but may include a case of being connected to an object with another element interposed therebetween. The "connection" means, for example, a relationship capable of allowing a signal to flow.

A memory system includes a semiconductor memory device, and a memory controller configured to control the semiconductor memory device. A semiconductor integrated circuit included in the memory controller may include a circuit (DQS output circuit) configured to output a DQS signal that is a write data strobe signal, and a circuit (REB output circuit) configured to output a REB signal that is a source signal for a read data strobe signal. Each of the DQS output circuit and the REB output circuit includes a circuit that needs a large mounting area. Therefore, it may be difficult to reduce a size and power consumption of the semiconductor integrated circuit.

Therefore, in a semiconductor integrated circuit of an embodiment, a part of a configuration of the DQS output circuit and a part of a configuration of the REB output circuit are shared each other. Hereby, it may be possible to reduce the size and the power consumption of the semiconductor integrated circuit. Hereinafter, such a semiconductor integrated circuit will be described. However, the present invention is not limited to the embodiment described below.

EMBODIMENT

1. Overall Configuration of Memory System

Figure 1:
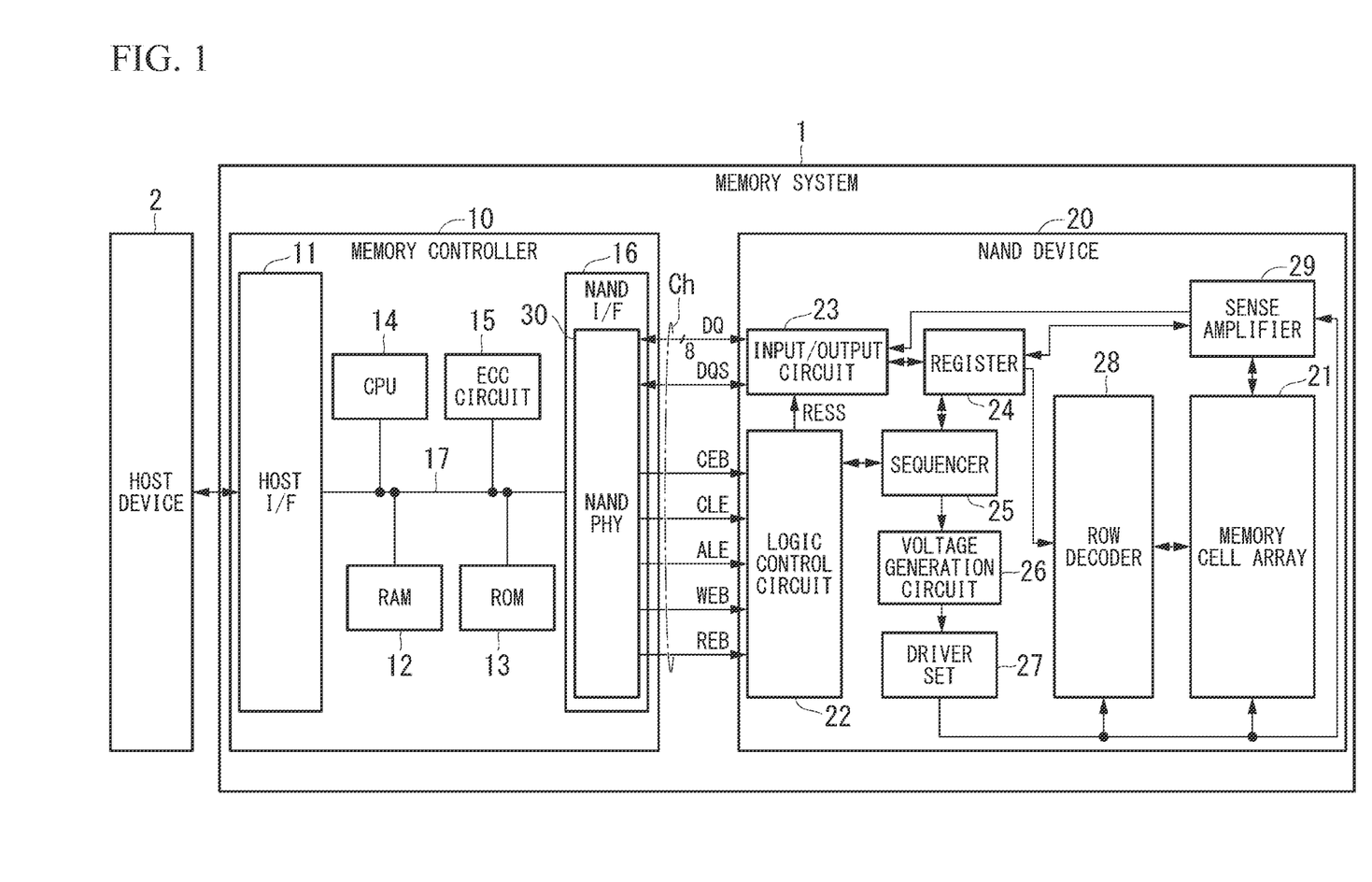
FIG. 1 is a block diagram showing a configuration of a memory system in an embodiment.

FIG. 1 is a block diagram showing a configuration of a memory system 1 in an embodiment. The memory system 1 is, for example, a storage device and configured to be connected to a host device 2. The memory system 1 serves as an external storage device for the host device 2. The host device 2 is, for example, a controller configured to control the memory system 1 in an information processing device such as a server device, a personal computer, or a mobile information processing device. The host device 2 is capable of outputting an access request (a read request, and/or a write request) with respect to the memory system 1.

The memory system 1 includes, for example, a memory controller 10 and a plurality of NAND devices 20 (only one NAND device 20 is shown in FIG. 1). The memory controller 10 is an example of a "controller." Each NAND device 20 is an example of a "semiconductor memory device."

<1.1 Configuration of Memory Controller>

The memory controller 10 includes, for example, a host interface circuit (host I/F) 11, a RAM (Random Access Memory) 12, a ROM (Read Only Memory) 13, a CPU (Central Processing Unit) 14, an ECC (Error Correcting Code) circuit 15, and a NAND interface circuit (NAND I/F) 16. These configurations are connected to one another via a bus 17. For example, the memory controller 10 is configured as a system on a chip (SoC) in which those configurations are provided in one chip. However, one or more of these configurations may be provided outside the memory controller 10. One or more of the RAM 12, the ROM 13, the CPU 14, and the ECC circuit 15 may be provided inside the NAND I/F 16.

The host I/F 11 performs, under the control of the CPU 14, control of a communication interface between the host device 2 and the memory system 1, and control of data transfer between the host device 2 and the RAM 12.

The RAM 12 is, for example, a synchronous dynamic random access memory (SDRAM) or a static random access memory (SRAM). However, the RAM 12 is not limited to the above examples. The RAM 12 serves as a buffer for data transfer between the host device 2 and the NAND device 20. The RAM 12 provides a work area for the CPU 14. A firmware (a program) stored in the ROM 13 is loaded into the RAM 12 when the memory device 1 operates.

The CPU 14 is an example of a hardware processor. The CPU 14 controls operations of the memory controller 10 by executing the firmware loaded in the RAM 12, for example. The CPU 14 controls operations relating to writing of data, reading of data, and erasing for the NAND device 20, for example.

The ECC circuit 15 performs an encoding for an error correction on data that is to be written into the NAND device 20. If there is an error in read data from the NAND device 20, the ECC circuit 15 performs the error correction on the read data based on an error correction code generated when a data write operation is performed.

The NAND I/F 16 performs, under the control of the CPU 14, control of data transfer between the RAM 22 and the NAND device 20. In the embodiment, the NAND I/F 16 has a plurality of channels ch (only one channel ch is shown in FIG. 1). The NAND I/F 16 includes a plurality of NAND Phys 30 corresponding to the number of channels ch, for example.

Figure 2:
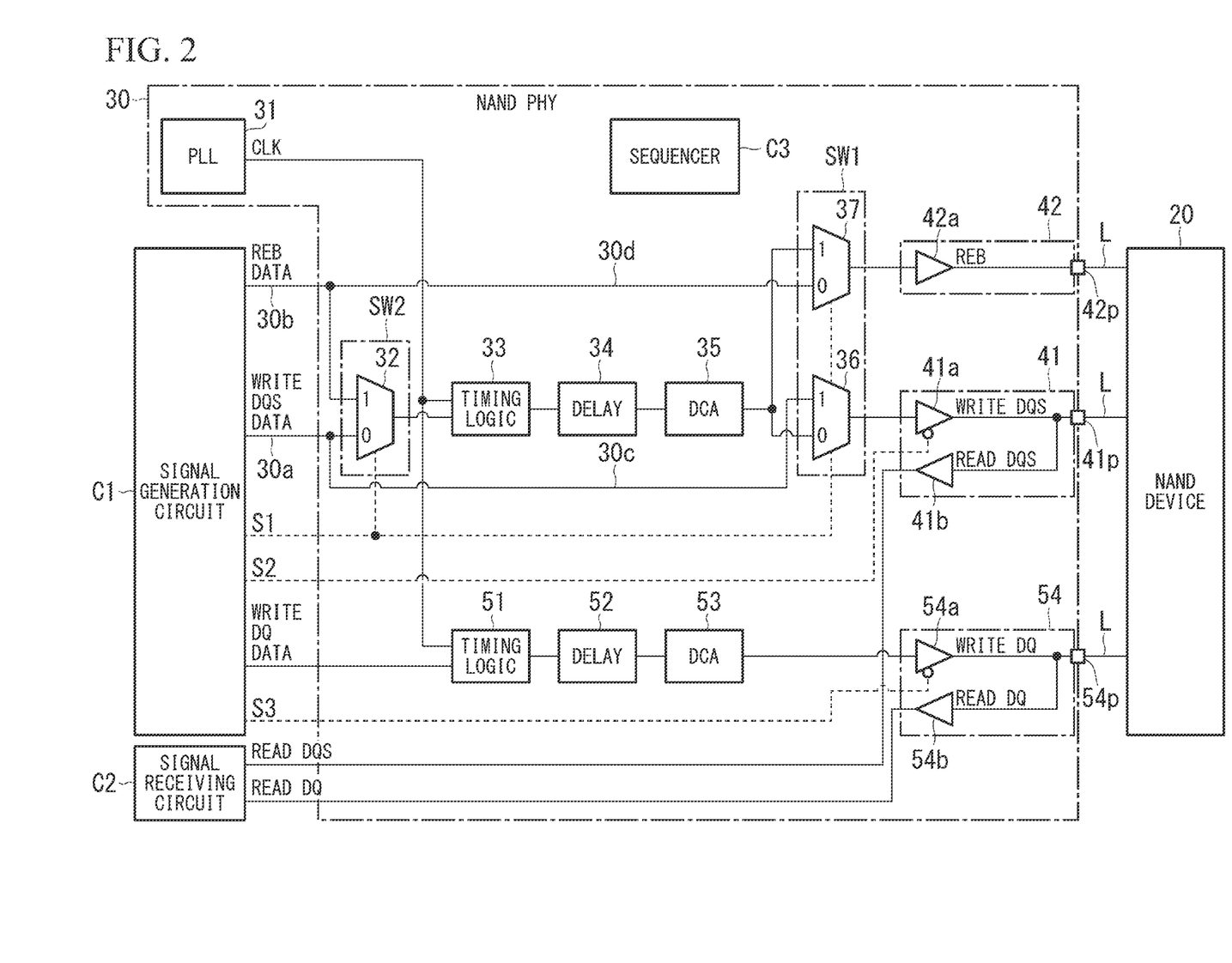
FIG. 2 is a block diagram showing a configuration of a NAND Phy in the embodiment.

Each NAND Phy 30 is a physical layer that is a part of an output/receiving circuit of the NAND I/F 16. The NAND Phy 30 converts digital signals that are to be output from the memory controller 10 to the NAND device 20 into electrical signals. The NAND Phy 30 outputs the converted electrical signals to the NAND device 20 through transmission lines L that are between the memory controller 10 and the NAND device 20 (only some of the transmission lines L are shown in FIG. 2). The NAND Phy 30 receives electrical signals transmitted from the NAND device 20 through the transmission lines L. The transmission lines L may be provided as differential transmission lines. The NAND Phy 30 converts the received electrical signals into digital signals. An internal configuration of the NAND Phy 30 will be described later. The NAND Phy 30 is an example of a "semiconductor integrated circuit."

As shown in FIG. 1, signals that are output or received between the NAND Phy 30 and the NAND device 20 include data signals (DQ), data strobe signals (DQS), a chip enable signal (CEB), a command latch enable signal (CLE), an address latch enable signal (ALE), a write enable signal (WEB), a read enable signal (REB), a write protect signal (WP) that is not shown, and the like. These signals are output or received via individual transmission lines L. The data signals (DQ) may be signals output in parallel. Each of the data strobe signals (DQS), the write enable signal (WEB), and the read enable signal (REB) may be a differential signal.

The data signals (DQ) include a signal indicating a content of data to be written into the NAND device 20 (hereinafter referred to as "write data"), a signal indicating a content of data read from the NAND device 20 (hereinafter referred to as "read data"), signals indicating various commands, a signal indicating an address of data write destination or data read destination, and the like. The data signals (DQ) are output or received in a unit of 8 bits via eight transmission lines L that are independent one another, for example. In the embodiment, the write data and the read data, which are the data signal (DQ), may be referred to as "write DQ" and "read DQ", respectively. The write DQ is an example of "first data." The read DQ is an example of "second data."

The data strobe signals (DQS) are strobe signals corresponding to the data signals (DQ). As the data strobe signals (DQS), there are a write data strobe signal (hereinafter referred to as "write DQS") corresponding to the write DQ and a read data strobe signal (hereinafter referred to as "read DQS") corresponding to the read DQ.

The write DQS is output from the NAND Phy 30 to the NAND device 20 together with the write DQ, and is used for capturing the write data in the NAND device 20. The write DQS is a signal that is output according to an output of the write DQ, and includes a toggle signal (that is, a signal in which "L" ("Low") level and "H" ("High") level are alternately repeated). The write DQS is an example of a "first signal" and an example of a "first strobe signal."

The read DQS is output from the NAND device 20 to the NAND Phy 30 together with the read DQ, and is used for capturing the read data in the NAND Phy 30. The read DQS is a signal that is output according to an output of the read DQ, and includes the toggle signal. The read DQS is an example of a "second strobe signal" and also is an example of a "fifth signal." In the embodiment, the read DQS is generated in the NAND device 20 based on a source signal (read data strobe source signal) that is output from the NAND Phy 30 to the NAND device 20, and is output from the NAND device 20 to the NAND Phy 30. This will be described later.

The chip enable signal (CEB) enables a selection of the NAND device 20 to be accessed among the plurality of NAND devices 20, and is asserted when the NAND device 20 is selected. The chip enable signal (CEB) is an active "L" signal, and is asserted at the "L" level, for example. The command latch enable signal (CLE) enables a command transmitted from the NAND Phy 30 to the NAND device 20 to be latched into a command register in the NAND device 20. The address latch enable signal (ALE) enables an address transmitted from the NAND Phy 30 to the NAND device 20 to be latched into an address register in the NAND device 20. The command latch enable signal (CLE) and the address latch enable signal (ALE) are active "H" signals, and are asserted at the "H" level, for example.

The write enable signal (WEB) enables transmitting data (for example, a command or an address) to the NAND device 20. The write enable signal (WEB) is an active "L" signal, and is asserted at the "L" level, for example. The read enable signal (REB) enables reading data from the NAND device 20. In the embodiment, the read enable signal (REB) may include a read data-strobe-source signal. The read data strobe source signal is a toggle signal that is a source for the read DQS. This will be described later. The read enable signal (REB) is a signal that is output for receiving the read DQ, and is an example of a "second signal." The write protect signal WP is a signal that is asserted w % ben writing and erasing are prohibited.

In the embodiment, the "L" level is an example of a "first voltage level", and the "H" level is an example of a "second voltage level." However, the definitions of the "first voltage level" and the "second voltage level" are not limited to the above example. The "H" level may be an example of the "first voltage level" and the "L" level may be an example of the "second voltage level."

<1.2 Configuration of NAND Device>

The NAND device 20 includes, for example, a memory cell array 21, a logic control circuit 22, an input/output circuit 23, a register 24, a sequencer 25, a voltage generation circuit 26, a driver set 27, a row decoder 28, and a sense amplifier 29.

The memory cell array 21 includes a plurality of non-volatile memory cell transistors (not shown) associated with word lines and bit lines, and stores data in a nonvolatile manner.

The logic control circuit 22 receives, from the NAND Phy 30, the chip enable signal (CEB), the command latch enable signal (CLE), the address latch enable signal (ALE), the write enable signal (WEB), the read enable signal (REB), the write protect signal (WP), and the like.

In the embodiment, the read enable signal (REB) output from the NAND Phy 30 to the logic control circuit 22 includes a read data-strobe-source signal (RESS) (see FIG. 6, hereinafter, referred to as a "source signal RESS"). The source signal RESS is a toggle signal that is a source for the read DQS. The logic control circuit 22 transmits the received source signal RESS to the input/output circuit 23.

The input/output circuit 23 outputs or receives the data signals (DQ) and the data strobe signals (DQS) between the input/output circuit 23 and the NAND Phy 30. The input/output circuit 23 determines a command and an address in the data signal (DQ) based on the write enable signal (WEB), and transfers the determined command and address to the register 24, for example. The input/output circuit 23 receives the write DQ and the write DQS from the NAND Phy 30, reads write data using the write DQS, and outputs the read write data to the sense amplifier 29.

The input/output circuit 23 receives read data from the sense amplifier 29. The input/output circuit 23 generates read DQ from the received read data by using the source signal RESS received from the logic control circuit 22 as an operation clock. Further, the input/output circuit 23 generates read DQS by using the source signal RESS as the operation clock. The input/output circuit 23 outputs the generated read DQ and read DQS to the NAND Phy 30.

The register 24 stores a command and an address. The register 24 transfers the address to the row decoder 28 and the sense amplifier 29. The register 24 transfers the command to the sequencer 25. The sequencer 25 receives the command and controls the entire NAND device 20 according to a sequence based on the received command.

The voltage generation circuit 26 generates voltages required for operations such as writing of data, reading of data, and erasing based on instructions from the sequencer 25. The voltage generation circuit 26 supplies the generated voltages to the driver set 27. The driver set 27 includes a plurality of drivers, and supplies various voltages received from the voltage generation circuit 26 to the row decoder 28 and the sense amplifier 29 based on the addresses received from the register 24. The driver set 27 supplies various voltages to the row decoder 28 based on a row address in the address, for example.

The row decoder 28 receives the row address included in the address from the register 24 and selects a memory cell in a row based on the row address. A voltage from the driver set 27 is transferred to the memory cell in the selected row via the row decoder 28.

When data is read from the memory cell transistors to the bit lines, the sense amplifier 29 senses the read data and transfers the sensed read data to the input/output circuit 23. When data is written, the sense amplifier 29 transfers write data to be written to the memory cell transistors via the bit lines. The sense amplifier 29 receives a column address in the address from the register 24, and outputs data from a column based on the column address.

2. Configuration of NAND Phy

FIG. 2 is a block diagram showing a configuration of the NAND Phy 30. FIG. 2 shows a part of a circuit relating to output/receiving of signals extracted in the NAND Phy 30. NAND Phy 30 is connected to a signal generation circuit C1 and a signal receiving circuit C2. The signal generation circuit C1 and the signal receiving circuit C2 are circuits included in the NAND I/F 16, for example. However, apart or the whole of each of the signal generation circuit C1 and the signal receiving circuit C2 may be realized by the CPU 14 executing the firmware. A part or the whole of each of the signal generation circuit C1 and the signal receiving circuit C2 may be provided as a part of the NAND Phy 30. The signal receiving circuit C2 is an example of a "receiving circuit."

NAND Phy 30 includes, for example, a PLL circuit 31, a first multiplexer 32, a first timing logic circuit 33, a first delay circuit 34, a first duty adjusting circuit 35, a second multiplexer 36, a third multiplexer 37, a first input/output circuit 41, a second input/output circuit 42, a second timing logic circuit 51, a second delay circuit 52, a second duty adjusting circuit 53, a third input/output circuit 54, and a sequencer C3. In the embodiment, for convenience of explanation, a circuit having at least one of an input function and an output function of signal is expressed as an "input/output circuit". For example, the second input/output circuit 42 has only an output function of signal, and does not have an input function of signal from the NAND device 20.

The PLL (Phase Looked Loop) circuit 31 is a phase synchronization circuit, and includes an oscillator for an operation clock CLK. The PLL circuit 31 is connected to a second input terminal of the first timing logic circuit 33 and a second input terminal of the second timing logic circuit 51. The PLL circuit 31 supplies a generated operation clock CLK to the first timing logic circuit 33 and the second timing logic circuit 51.

A first input terminal of the first multiplexer 32 is connected to the signal generation circuit C1 via a first signal line 30a. The signal generation circuit C1 outputs, to the first signal line 30a, a signal indicating an output pattern of the write DQS. This single is hereinafter referred to as "write DQS data" (or write DQS data signal). The write DQS data is an example of a "third signal."

A second input terminal of the first multiplexer 32 is connected to the signal generation circuit C1 via a second signal line 30b. The signal generation circuit C1 outputs, to the second signal line 30b, a signal indicating an output pattern of the read enable signal (REB). This single is hereinafter referred to as "REB data" (or REB data signal"). The REB data is an example of a "fourth signal."

An output terminal of the first multiplexer 32 is connected to a first input terminal of the first timing logic circuit 33. A DQS/REB selection signal (hereinafter referred to as a "control signal S1") is input to a control terminal of the first multiplexer 32 from the signal generation circuit C1. The control signal S1 is switched to the "L" level in a case where a data write operation (first operation) to the NAND device 20 is performed and switched to the "H" level in a case where a data read operation (second operation) from the NAND device 20 is performed by the signal generation circuit C1.

The first multiplexer 32 connects the first input terminal of the first multiplexer 32 to the output terminal of the first multiplexer 32 in a case where the control signal S1 at the "L" level is input. Thereby, the write DQS data that is output from the signal generation circuit C1 to the first signal line 30a is input to the first timing logic circuit 33 through the first multiplexer 32 in the case where the data write operation to the NAND device 20 is performed.

On the other hand, the first multiplexer 32 connects the second input terminal of the first multiplexer 32 to the output terminal of first multiplexer 32 in a case where the control signal S1 at the "H" level is input. Thereby, the REB that is output from the signal generation circuit C1 to the second signal line 30b is input to the first timing logic circuit 33 through the first multiplexer 32 in the case where the data read operation from the NAND device 20 is performed. In the embodiment, the first multiplexer 32 constitutes a switch circuit SW2 configured to selectively connect one of the first signal line 30a and the second signal line 30b to the first timing logic circuit 33. The switch circuit SW2 is an example of a "second switch circuit."

The switch circuit SW2 selects alternatively one of a first connection state (third connection state) in which the first signal line 30a is connected to the third circuit described later, and a second connection state (fourth connection state) in which the second signal line 30b is connected to the third circuit described later. The switch circuit SW2 selects the first connection state in the case where the data write operation (first operation) to the NAND device 20 is performed, and selects the second connection state in the case where the data read operation (second operation) from the NAND device 20 is performed. In the embodiment, the switch circuit SW2 includes a multiplexer which connects the first signal line 30a to the third circuit described later in the first connection state and which connects the second signal line 30b to the third circuit described later in the second connection state.

The first timing logic circuit 33 generates a signal whose timing is adjusted based on a signal input from the first multiplexer 32 and the operation clock CLK input from the PLL circuit 31. The first timing logic circuit 33 is an example of a "signal generation circuit."

Figure 3:
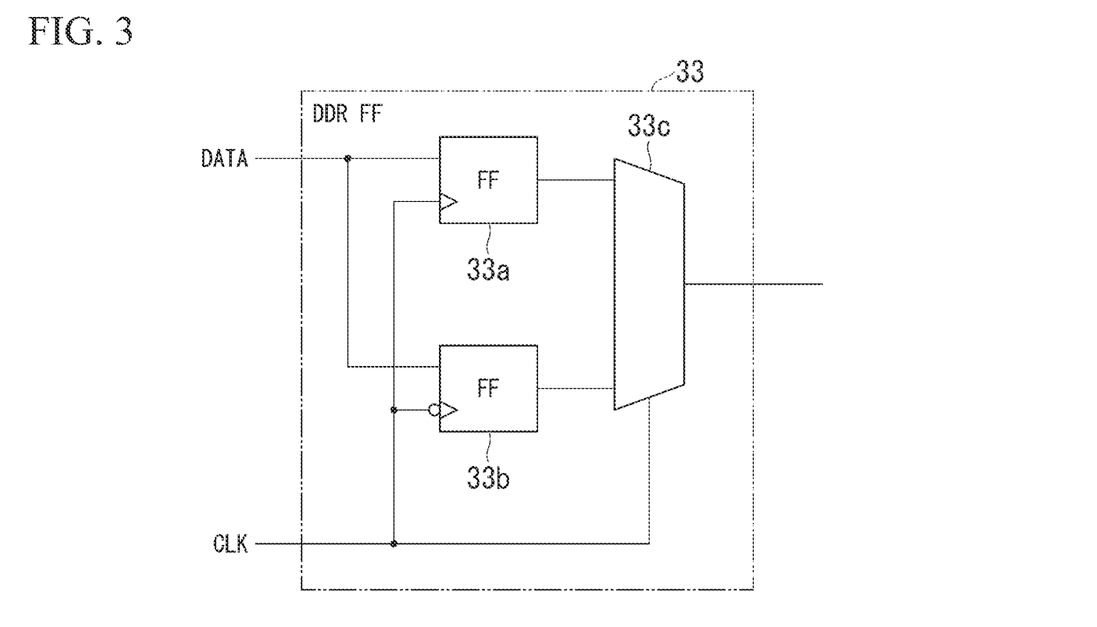
FIG. 3 is a block diagram showing a part of an internal configuration of a timing logic circuit in the embodiment.

Here, a configuration of the first timing logic circuit 33 will be described with reference to FIG. 3. FIG. 3 is a block diagram showing a part of an internal configuration of the first timing logic circuit 33. The first timing logic circuit 33 includes, for example, a DDR (Double Data Rate) flip-flop circuit (hereinafter referred to as a "DDR_FF circuit"). The DDR_FF circuit is a circuit that outputs a logical value of an input signal DATA at a speed twice that of the input operation clock CLK (that is, a speed of ½ cycle compared to the input operation clock CLK). The DDR_FF circuit includes, for example, a first flip-flop circuit 33a (hereinafter referred to as "first FF circuit 33a") a second flip-flop circuit 33b (hereinafter referred to as "second FF circuit 33b"), and a multiplexer 33c.

A signal input terminal of the first FF circuit 33a is connected to the output terminal of the first multiplexer 32. A clock input terminal of the first FF circuit 33a is connected to an output terminal of the PLL circuit 31. A signal input terminal of the second FF circuit 33b is connected to the output terminal of the first multiplexer 32. A clock input terminal of the second FF circuit 33b is connected to the output terminal of the PLL circuit 31 via a logic inversion circuit.

A first input terminal of the multiplexer 33c is connected to an output terminal of the first FF circuit 33a. A second input terminal of the multiplexer 33c is connected to an output terminal of the second FF circuit 33b. A control terminal of the multiplexer 33c is connected to the output terminal of the PLL circuit 31. An output terminal of the multiplexer 33c is an output terminal of the first timing logic circuit 33. The multiplexer 33c is switched between a first state in which the output terminal of the first FF circuit 33a is connected to the output terminal of the multiplexer 33c, and a second state in which the output terminal of the second FF circuit 33b is connected to the output terminal of the multiplexer 33c, based on the operation clock CLK input to the control terminal.

The first timing logic circuit 33 updates a value output from the output terminal of the first timing logic circuit 33 at a rising edge and a falling edge of each cycle of the operation clock CLK, for example. As a result, the first timing logic circuit 33 generates a signal whose timing is adjusted based on the operation clock CLK. However, the configuration of the first timing logic circuit 33 is not limited to the above example, and various configurations having the same or similar functions may be adopted.

The explanation will be continued with reference to FIG. 2. The first timing logic circuit 33 generates the write DQS based on the write DQS data and the operation clock CLK in a case where the write DQS data is input from the first multiplexer 32. The first timing logic circuit 33 outputs the generated write DQS to the first delay circuit 34. On the other hand, the first timing logic circuit 33 generates the read enable signal (REB) including the source signal RESS based on the REB data and the operation clock CLK in a case where the REB data is input from the first multiplexer 32. The first timing logic circuit 33 outputs the generated read enable signal (REB) to the first delay circuit 34.

The first delay circuit 34 delays a signal input to the first delay circuit 34. The first delay circuit 34 includes, for example, a plurality of delay elements connected in series, and is able to change the number of the delay elements based on an external signal (for example, a control signal from the sequencer C3 in the NAND Phy 30). The first delay circuit 34 is capable of adjusting a delay amount of the input signal by changing the number of the delay elements. For example, the first delay circuit 34 is capable of adjusting a skew of the write DQS with respect to the write DQ by delaying the write DQS. An output terminal of the first delay circuit 34 is connected to an input terminal of the first duty adjustment circuit 35.

The first duty adjusting circuit 35 (Duty Cycle Adjuster: DCA, hereinafter referred to as a "first DCA circuit 35") adjusts a duty ratio of a signal (the write DQS or the read enable signal (REB)) generated by the first timing logic circuit 33. The first duty adjusting circuit 35 is capable of adjusting a timing of an edge of a signal input to the first duty adjusting circuit 35, and is an example of an "adjusting circuit." An output terminal of the first DCA circuit 35 is connected to a first input terminal of the second multiplexer 36 and a second input terminal of the third multiplexer 37. In the embodiment, an example of the "third circuit" is constituted by any one or a combination of the first timing logic circuit 33, the first delay circuit 34, and the first DCA circuit 35."

Figure 4:
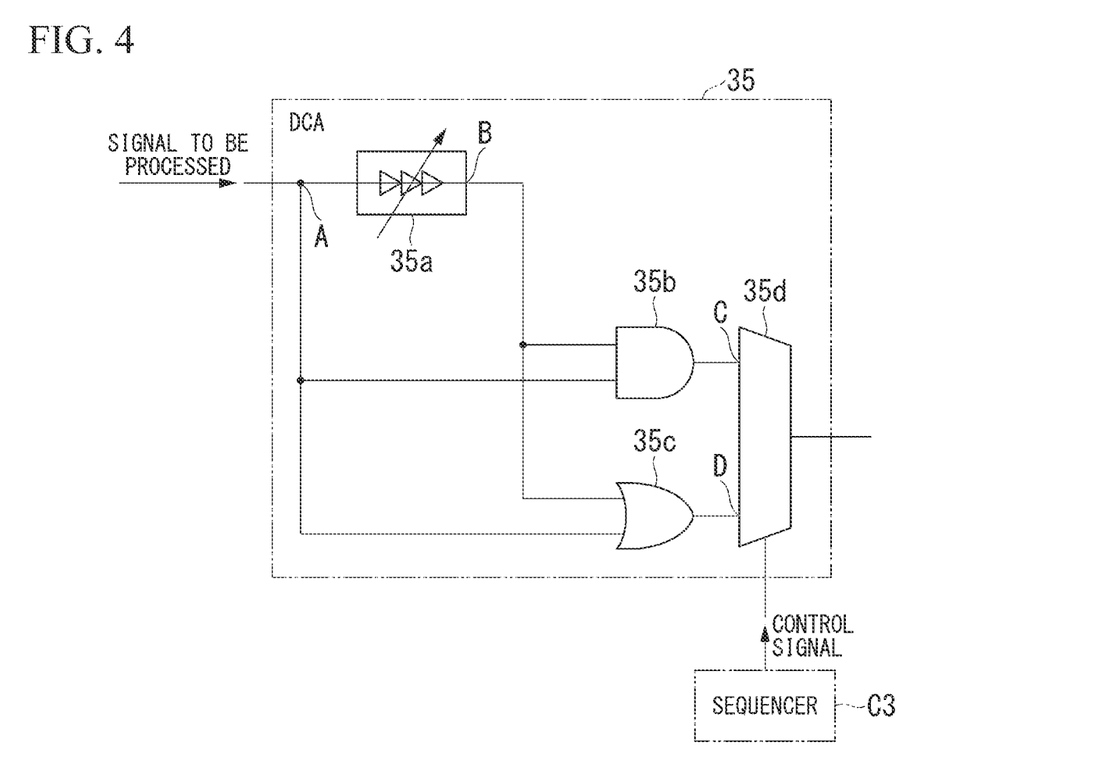
FIG. 4 is a block diagram showing an internal configuration of a DCA circuit in the embodiment.

Here, the configuration of the first DCA circuit 35 will be described with reference to FIG. 4. FIG. 4 is a block diagram showing an internal configuration of the first DCA circuit 35. The first DCA circuit 35 includes, for example, a delay circuit 35a, an AND element 35b, an OR element 35c, and a multiplexer 35d.

The delay circuit 35a delays a signal (the write DQS or the read enable signal (REB)) input to the first DCA circuit 35. For example, the delay circuit 35a includes a plurality of delay elements connected in series and be able to change the number of the delay elements based on a signal from the outside (for example, a control signal from the sequencer C3 in the NAND Phy 30). The delay circuit 35a is capable of adjusting an amount of delay of the input signal by changing the number of the delay elements. The configuration of the delay circuit 35a may be the same as the configuration of the first delay circuit 34.

A signal delayed by the delay circuit 35a is supplied to a first input terminal of the AND element 35b. The signal input to the first DCA circuit 35 is directly supplied to a second input terminal of the AND element 35b. Similarly, the signal delayed by the delay circuit 35a is supplied to a first input terminal of the OR element 35c. The signal input to the first DCA circuit 35 is directly supplied to a second input terminal of the OR element 35c.

A first input terminal of the multiplexer 35d is connected to an output terminal of the AND element 35b. A second input terminal of the multiplexer 35d is connected to an output terminal of the OR element 35c. An output terminal of the multiplexer 35d is an output terminal of the first DCA circuit 35. The multiplexer 35d is switched between a first state in which the output terminal of the AND element 35b is connected to the output terminal of the multiplexer 35d, and a second state in which the output terminal of the OR element 35c is connected to the output terminal of the multiplexer 35d, based on a signal from the outside (for example, a control signal from the sequencer C3 in the NAND Phy 30).

Figure 5:
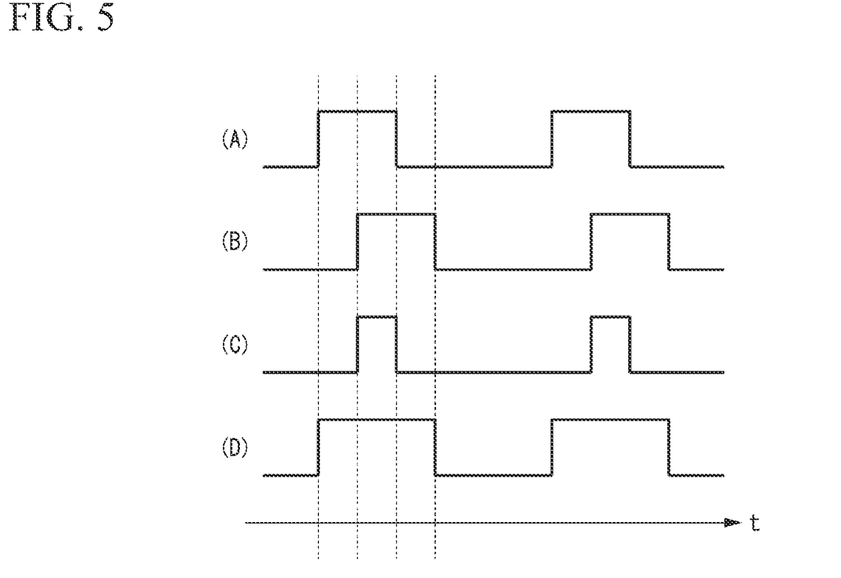
FIG. 5 is a timing chart showing a signal at each point in the DCA circuit in the embodiment.

FIG. 5 is a timing chart showing a signal at each point in the first DCA circuit 35. Part (A) of FIG. 5 shows a waveform of a signal (signal at point A in FIG. 4) that is immediately after being input to the first DCA circuit 35. Part (B) of FIG. 5 shows a waveform of a signal (signal at point B in FIG. 4) that is delayed by the delay circuit 35a. Part (C) of FIG. 5 shows a waveform of a signal (signal at point C in FIG. 4) that is input to the first input terminal of the multiplexer 35d. Part (D) of FIG. 5 shows a waveform of a signal (signal at point D in FIG. 4) that is input to the second input terminal of the multiplexer 35d.

As shown in FIG. 5, the sequencer C3 is capable of changing a duty ratio of a signal passing through the first DCA circuit 35 based on the delay amount of the signal by the delay circuit 35a and the state of the multiplexer 35d. For example, the sequencer C3 sets the multiplexer 35d in the first state to cause the duty ratio of the signal to be smaller than that of the original signal. The sequencer C3 sets the multiplexer 35d in the second state to cause the duty ratio of the signal to be larger than that of the original signal. For example, the sequencer C3 causes the signal input to the first DCA circuit 35 (see Part (A) of FIG. 5) to be delayed by the delay circuit 35a for a quarter period (see Part (B) of FIG. 5) and select the signal (see part (D) of FIG. 5) that is input to the second input terminal of the multiplexer 35d. As a result, the duty ratio becomes large (the "H" level period becomes long) so that the duty is arranged.

The explanation will be continued with reference to FIG. 2. The signal that has passed through the first DCA circuit 35 is input to a first input terminal of the second multiplexer 36. A second input terminal of the second multiplexer 36 is connected to the first signal line 30a via a first bypass signal line 30c. Thereby, the DQS data that is output from the signal generation circuit C1, is input to the second input terminal of the second multiplexer 36 via the first signal line 30a. An output terminal of the second multiplexer 36 is connected to a driver 41a of the first input/output circuit 41. Similar to the first multiplexer 32, the control signal S1 is input to a control terminal of the second multiplexer 36.

The second multiplexer 36 connects the first input terminal of the second multiplexer 36 to the output terminal of the second multiplexer 36 in a case where the control signal S1 at the "L" level is input. In other words, the second multiplexer 36 connects the first DCA circuit 35 to the first input/output circuit 41. Thereby, the write DQS that is output from the first DCA circuit 35 passes through the second multiplexer 36 and is input to the first input/output circuit 41 in the case where the write operation to the NAND device 20 is performed. In this case, the first input/output circuit 41 outputs the write DQS to the NAND device 20.

On the other hand, the second multiplexer 36 connects the second input terminal of the second multiplexer 36 to the output terminal of the second multiplexer 36 in the case where the control signal S1 at the "H" level is input. In other words, the second multiplexer 36 connects the first signal line 30a to the first input/output circuit 41 via the first bypass signal line 30c with a state where the connection between the first DCA circuit 35 and the first input/output circuit 41 is disconnected. Thereby, the write DQS data that is input from the signal generation circuit C1 to the first signal line 30a passes through the second multiplexer 36 and is input to the first input/output circuit 41 in the case where the read operation from the NAND device 20 is performed. In this case, the first input/output circuit 41 output, to the NAND device 20, the write DQS data that is maintained at the "H" level by the signal generation circuit C1. The write DQS data at the "H" level is a signal indicating a negate state of writing of data to the NAND device 20.

A first input terminal of the third multiplexer 37 is connected to the second signal line 30b via a second bypass line 30d. Thereby, the REB data that is output from the signal generation circuit C1 to the second signal line 30b is input to the first input terminal of the third multiplexer 37. A signal that has passed through the first DCA circuit 35 is input to a second input terminal of the third multiplexer 37. An output terminal of the third multiplexer 37 is connected to a driver 42a of the second input/output circuit 42. Similar to the first multiplexer 32 and the second multiplexer 36, the control signal C1 from the signal generation circuit C1 is input to a control terminal of the third multiplexer 37.

The third multiplexer 37 connects the first input terminal of the third multiplexer 37 to the output terminal of the third multiplexer 37 in a case where the control signal S1 at the "L" level is input. In other words, the third multiplexer 37 connects the second signal line 30b to the second input/output circuit 42 via the second bypass signal line 30d in a state where the connection between the first DCA circuit 35 and the second input/output circuit 42 is disconnected. Thereby, the REB data that is output from the signal generation circuit C1 to the second signal line 30b passes through the third multiplexer 37 and is input to the second input/output circuit 42 in the case where the write operation to the NAND device 20 is performed. In this case, the second input/output circuit 42 outputs, to the NAND device 20, the REB data that is maintained at the "H" level by the signal generation circuit C1. The REB data at the "H" level is a signal indicating a negate state of reading of data from the NAND device 20.

On the other hands, third multiplexer 37 connects the second input terminal of the multiplexer 37 to the output terminal of the third multiplexer 37 in the case where the control signal S1 at the "H" level is input. In other words, third multiplexer 37 connects the first DCA circuit 35 to the second input/output circuit 42. Thereby, the read enable signal (REB) that is output from the first DCA circuit 35 passes through the third multiplexer 37 and is input to the second input/output circuit 42 in the case where the data reading operation from the NAND device 20 is performed. In this case, the second input/output circuit 42 outputs the read enable signal (REB) to the NAND device 20.

In the embodiment, a switch circuit SW1 configured to selectively connect the first DCA circuit 35 to one of the first input/output circuit 41 and the second input/output circuit 42 is constituted by the second multiplexer 36 and third multiplexer 37. The switch circuit SW1 is an example of a "first switch circuit." The second multiplexer 36 is an example of a "first connecting circuit." The third multiplexer 37 is an example of a "second connecting circuit."

The switch circuit SW1 connects the third circuit described above to the first input/output circuit 41 in the case where the write DQS is output from the first input/output circuit 41 to the NAND device 20 in relation to outputting the write DQ to the NAND device 20 by the third input/output circuit 54 described later. On the other hand, the switch circuit SW1 connects the third circuit described above to the second input/output circuit 42 in the case where the source signal RESS is output from the second input/output circuit 42 to the NAND device 20 in relation to receiving the read DQ from the NAND device 20 by the third input/output circuit 54. The word "in relation to" means related to achieving a certain process (such as writing or reading of data), and is not limited to a case where two operations are synchronized, and may include a case where two operations are not synchronized.

In the embodiment, the switch circuit SW1 connects the third circuit described above to the first input/output circuit 41 in the case where the write DQS is output from the first input/output circuit 41 to the NAND device 20 in a period B (in an example of FIG. 6, the period from the time point t5 to the time point t6) at least a part of which overlaps with a period A (in an example of FIG. 6, the period from the time point t5 to the time point t6) in which the third input/output circuit 54 outputs the write DQ to the NAND device 20. The time point t5 is, for example, a time point when a first rising edge of the write DQS is output from the first input/output circuit 41. Time point t6 is, for example, a time point when a last falling edge of the write DQS is output from the first input/output circuit 41. The period B may be started before the period A or may be ended after the period A.

On the other hand, the switch circuit SW1 connects the third circuit described above to the second input/output circuit 42 in the case where the source signal RESS is output from the second input/output circuit 42 to the NAND device 20 in a period D (in an example of FIG. 6, the period from the time point t13 to the time point t14) at least a part of which precedes a period C (in an example of FIG. 6, the period from the time point t13' to the time point t14') in which the third input/output circuit 54 receives the read DQ from the NAND device 20. Time point t13' is, for example, a time point when the first input/output circuit 41 receives a first rising edge of the read DQS. Time point t14' is, for example, a time point when the first input/output circuit 41 receives a last falling edge of the read DQS. Time point t13 is, for example, a time point when a first rising edge of the source signal RESS is output from the second input/output circuit 42. Time point t14 is, for example, the time point when a last falling edge of the source signal RESS is output from the second input/output circuit 42. The period D is a period starts before the period C and is partially overlapped with the period C. The period D may end before the period C starts.

The switch circuit SW1 is configured to select alternatively one of a first connection state in which the third circuit described above is connected to the first input/output circuit 41 and the second signal line 30b is connected to second input/output circuit 42, and a second connection state in which the third circuit described above is connected to the second input/output circuit 42 with a state in which the connection between the second signal line 30b and the second input/output circuit 42 is disconnected. The switch circuit SW1 selects the first connection state in the case where the data write operation (first operation) to the NAND device 20 is performed, and selects the second connection state in the case where the data read operation (second operation) from the NAND device 20 is performed. In the embodiment, the switch circuit SW1 includes the multiplexer 37 which connects the second signal line 30b to the second input/output circuit 42 in the first connection state, and which connects the third circuit described above to the second input/output circuit 42 in the second connection state.

The first input/output circuit 41 includes, for example, a first terminal 41p, the driver 41a, and a receiver 41b. The first terminal 41p is, for example, a terminal for connecting the NAND Phy 30 to the outside, and is connected to the NAND device 20) via the transmission line L. The driver 41a and the receiver 41b share the first terminal 41p.

The driver 41a outputs a signal (the write DQS or the write DQS data) input to the first input/output circuit 41 to the NAND device 20 via the first terminal 41p and the transmission line L. For example, a write DQS-output enable signal (hereinafter referred to as a "control signal S2") is input from the signal generation circuit C1 to a control terminal of the driver 41a. The driver 41a is able to output, to the NAND device 20, the signal that is input is from the second multiplexer 36 to the first input/output circuit 41 in a case where the control signal S2 is at the "L" level. On the other hand, the driver 41a suppresses the output of the signal that is input from the second multiplexer 36 to the first input/output circuit 41 in a case where the control signal S2 is at the "H" level. The driver 41a is an example of an "output buffer circuit."

The receiver 41b receives a signal (the read DQS) transmitted from the NAND device 20 to the first input/output circuit 41 via the transmission line L and the first terminal 41p. That is, the write DQS and the read DQS are output/received via the same transmission line L and the same terminal 41p. The receiver 41b outputs the received read DQS to the signal receiving circuit C2. The first input/output circuit 41 is an example of a "first circuit." The receiver 41b is an example of a "receiving buffer circuit."

The second input/output circuit 42 includes, for example, a second terminal 42p and a driver 42a. The second terminal 42p is, for example, a terminal for connecting the NAND Phy 30 to the outside, and is connected to the NAND device 20 via the transmission line L. The driver 42a outputs, to the NAND device 20 via the second terminal 42p and the transmission line L, a signal (the read enable signal (REB) or REB data) that is input to the second input/output circuit 42. The second input/output circuit 42 is an example of "second circuit." The driver 42a is an example of an "output buffer circuit."

A first input terminal of the second timing logic circuit 51 is connected to the signal generation circuit C1. A signal indicating a content of the write data (hereinafter referred to as "write DQ data") is output from the signal generation circuit C1 to the second timing logic circuit 51. The second timing logic circuit 51 generates the write DQ based on the write DQ data input from the signal generation circuit C1 and the operation clock CLK input from the PLL circuit 31. The generated write DQ is output to the second delay circuit 52. The second timing logic circuit 51 has, for example, a configuration similar to that of the first timing logic circuit 33, but may have a different configuration.

The second delay circuit 52 delays the write DQ input to the second delay circuit 52 as needed. The second delay circuit 52 has the same configuration as the first delay circuit 34, for example, but may have a different configuration.

The second duty adjusting circuit 53 (hereinafter referred to as a "second DCA circuit 53") is a circuit for adjusting a duty ratio of the write DQ which is generated by the second timing logic circuit 51 and which is delayed by the second delay circuit 52. An output terminal of the second DCA circuit 53 is connected to a driver 54a of the third input/output circuit 54. However, the second DCA circuit 53 may be omitted, or an equivalent delay circuit may be provided instead of the second DCA circuit 53.

The third input/output circuit 54 includes, for example, a third terminal 54p, the driver 54a, and a receiver 54b. The third terminal 54p is a terminal for connecting the NAND Phy 30 to the outside, and is connected to the NAND device 20 via the transmission line L. The driver 54a and the receiver 54b share the third terminal 54p. The third input/output circuit 54 is an example of "fourth circuit."

A signal (the write DQ) is input to the third input/output circuit 54. The driver 54a outputs the input signal (the write DQ) to the NAND device 20 via the third terminal 53p and the transmission line L. For example, a write DQ-output enable signal (hereinafter referred to as a "control signal S3") is input from the signal generation circuit C1 to a control terminal of the driver 54a. The driver 54a is able to output, to the NAND device 20, the signal input from the second DCA circuit 53 to the third input/output circuit 54 in a case where the control signal S3 is at the "L" level. On the other hand, the driver 54a suppresses the output of the signal input from the second DCA circuit 53 to the third input/output circuit 54 in a case where the control signal S3 is at the "H" level. The driver 54a is an example of an "output buffer circuit."

The receiver 54b receives a signal (the read DQ) input from the NAND device 20 to the third input/output circuit 54 via the transmission line L and the third terminal 54p. That is, the write DQ and the read DQ are output and received via the same transmission line L and the same terminal 54p. The receiver 54b outputs the received read DQ to the signal receiving circuit C2. The receiver 54b is an example of a "receiving buffer circuit."

The signal receiving circuit C2 receives the read DQS from the first input/output circuit 41. The signal receiving circuit C2 receives the read DQ from the third input/output circuit 54. The signal receiving circuit C2 reads read data from the read DQ based on the read DQS.

3. Operation

Figure 6:
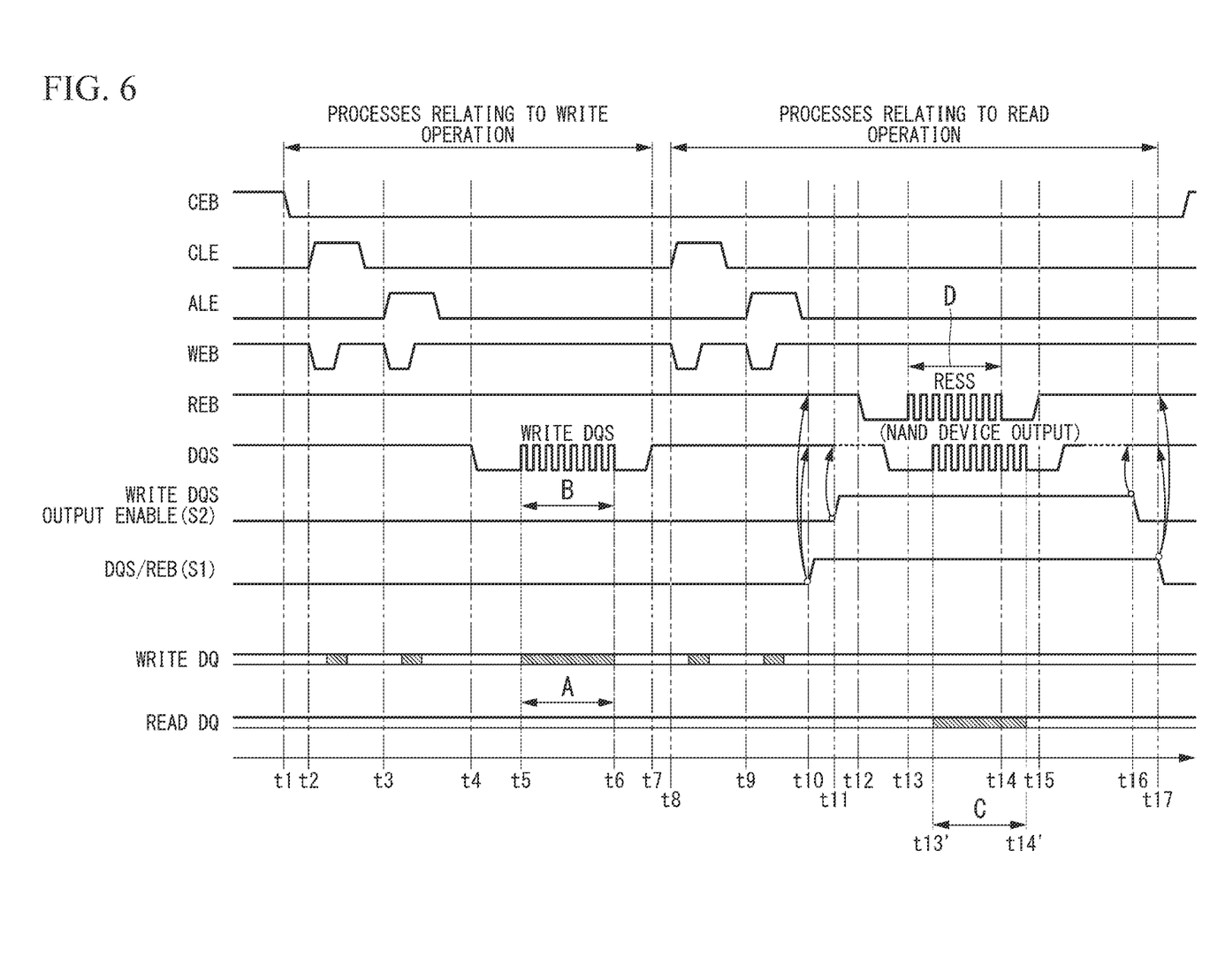
FIG. 6 is a timing chart showing an example of operations of the memory system in the embodiment.

FIG. 6 is a timing chart showing operations of the memory system 1. First, writing of data to the NAND device 20 will be described. The operation relating to writing of data is an example of "first operation." In the following description, it is assumed that time elapses in the order of time points t1, t2, .... tN (N is an arbitrary natural number).

In the embodiment, the signal generation circuit C1 maintains the control signal S1 to be input to the multiplexers 32, 36, and 37 at the "L" level in the case where the data write operation is performed. Thereby, the first signal line 30a is connected to the first timing logic circuit 33, and the first DCA circuit 35 is connected to the first input/output circuit 41. Further, the second signal line 30b is connected to the second input/output circuit 42 via the second bypass signal line 30d.

The signal generation circuit C1 changes the chip enable signal (CEB) regarding the NAND device 20 to be accessed from the "H" level to the "L" level at the time point t1. As a result, the chip enable signal (CEB) is asserted, and the NAND device 20 to be accessed is selected.

Next, the signal generation circuit C1 changes the command latch enable signal (CLE) from the "L" level to the "H" level and changes the write enable signal (WEB) from the "H" level to the "L" at the time point 2. As a result, the command latch enable signal (CLE) and the write enable signal (WEB) are asserted. Then, the signal generation circuit C1 changes the write enable signal (WEB) from the "L" level to the "H" level. In parallel with this operation, the signal generation circuit C1 outputs a write command instructing writing of data to the NAND device 20 by the write DQ via the NAND Phy 30. After outputting the write command, the signal generation circuit C1 returns the command latch enable signal (CLE) to the "L" level.

Next, the signal generation circuit C1 changes the address latch enable signal (ALE) from the "L" level to the "H" level and changes the write enable signal (WEB) from the 'H' level to the "L" at the time point t3. As a result, the address latch enable signal (ALE) and the write enable signal (WEB) are asserted. Then, the signal generation circuit C1 changes the write enable signal (WEB) from the "L" level to the "H" level. In parallel with this operation, the signal generation circuit C1 outputs a data write destination address to the NAND device 20 by the write DQ via the NAND Phy 30. After outputting the write destination address, the signal generation circuit C1 changes the address latch enable signal (ALE) to the "L" level.

Next, the signal generation circuit C1 changes the write DQS data input to the first signal line 30a from the "H" level to the "L" level at the time point t4. The first multiplexer 32 connects the first signal line 30a to the first timing logic circuit 33 in the case where the data write operation is performed. Thereby, the write DQS data input to the first signal line 30a passes through the first multiplexer 32 and is input to the first timing logic circuit 33. From the time point t5 to the time point t6, the first timing logic circuit 33 generates the write DQS, which is a toggle signal, based on the input write DQS data and the operation clock CLK, and outputs the generated write DQS to the first delay circuit 34.

A delay amount of the write DQS output from the first timing logic circuit 33 is adjusted by the first delay circuit 34, and a duty ratio of the write DQS is adjusted by the first DCA circuit 35. The second multiplexer 36 connects the first DCA circuit 35 to the first input/output circuit 41 in the case w % here the data write operation is performed. Thereby, the write DQS that has passed through the first DCA circuit 35 is input to the first input/output circuit 41 via the second multiplexer 36. The write DQS-output enable signal (the control signal S2) at the "L" level which allows the signal to be output is input from the signal generation circuit C1 to the driver 41a of the first input/output circuit 41. Thereby, the write DQS input to the first input/output circuit 41 is output from the first terminal 41*p* to the NAND device 20.

On the other hand, the signal generation circuit C1 inputs write data to the second timing logic circuit 51. The second timing logic circuit 51 generates write DQ based on the input write data and the operation clock CLK, and outputs the generated write DQ to the second delay circuit 52. The write DQ from the second timing logic circuit 51 is input to the third input/output circuit 54 via the second delay circuit 52 and the second DCA circuit 53. The write DQ-output enable signal (the control signal S3) at the "L" level which allows a signal to be output is input from the signal generation circuit C1 to the driver 54*a* of the third input/output circuit 54. As a result, the write DQ input to the third input/output circuit 54 is output from the third terminal 54*p* to the NAND device 20.

After that, the signal generation circuit C1 changes the write DQS data input to the first signal line 30*a* from the "L" level to the "H" level at the time point t7. As a result, a series of operations for writing of data ends.

The signal generation circuit C1 maintains the REB data to be input to the second signal line 30*b* at the "H" level in the case where the write operation described above is performed. That is, the signal generation circuit C1 maintains the read enable signal (REB) in the negate state (ineffective state). As mentioned above, the second signal line 30*b* is disconnected from the first timing logic circuit 33 by the first multiplexer 32 in the case where the data write operation is performed. Thereby, the REB data input to the second signal line 30*b* is not input to the first timing logic circuit 33.

The third multiplexer 37 connects the second bypass signal line 30*d* to the second input/output circuit 42 in the case where the data write operation is performed. That is, the REB data input from the second signal line 30*b* to the second bypass signal line 30*d* is input to the second input/output circuit 42 via the third multiplexer 37. The REB data which is input to the second input/output circuit 42 and which is maintained at the "H" level is output from the second terminal 42*p* to the NAND device 20. Thereby, what the read enable signal (REB) is in the negate state, that is, the memory controller 10 is in a ready state for the write operation is output to the NAND device 20.

Next, reading of data from the NAND device 20 will be described. The operation relating to reading of data is an example of "second operation." The example shown in FIG. 6 shows a case where the NAND device 20 selected in the data write operation is continuously targeted for reading of data. The example shown in FIG. 6 is an example in which the write enable signal (WEB) is also used for the transmission of the command and the address relating to the data read operation. The arrows in FIG. 6 indicate that the states of the multiplexers 32, 36 and 37 are switched by the control signal S1 at the time points t10 and t17, and the states of the driver 41*a* of the first input/output circuit 41 are switched by the control signal S2 at the time points t11 and t16.

The signal generation circuit C1 changes the command latch enable signal (CLE) from the "L" level to the "H" level and changes the write enable signal (WEB) from the "H" level to the "L" level at the time point t8. As a result, the command latch enable signal (CLE) and the write enable signal (WEB) are asserted. Then, the signal generation circuit C1 changes the write enable signal (WEB) from the "L" level to the "H" level. In parallel with this operation, the signal generation circuit C1 outputs a read command instructing reading of data to the NAND device 20 by the write DQ via the NAND Phy 30. After outputting the read command, the signal generation circuit C1 returns the command latch enable signal (CLE) to the "L" level.

Next, the signal generation circuit C1 changes the address latch enable signal (ALE) from the "L" level to the "H" level and changes the write enable signal (WEB) from the "H" level to the "L" at the time point t9. As a result, the address latch enable signal (ALE) and the write enable signal (WEB) are asserted. Then, the signal generation circuit C1 changes the write enable signal (WEB) from the "L" level to the "H" level. In parallel with this operation, the signal generation circuit C1 outputs a read destination address of data to the NAND device 20 by the write DQ via the NAND Phy 30. After outputting the read destination address, the signal generation circuit C1 returns the address latch enable signal (ALE) to the "L" level.

The signal generation circuit C1 changes the control signal S1 to be input the first to third multiplexers 32, 36, and 37 from the "L" level to the "H" level in the case where the data read operation is performed. Thereby, the second signal line 30*b* is connected to the first timing logic circuit 33, and the first DCA circuit 35 is connected to the second input/output circuit 42. Further, the first signal line 30*a* is connected to the first input/output circuit 41 via the first bypass signal line 30*c*. Here, the change of level of the control signal S1 from the "L" level to the "H" level is performed at the time point t10, for example, but not limited to the above example. The change of the control signal S1 from the "L" level to the "H" level may be performed before the time point t9 or before the time point t8 as long as it is after the time point t7. The signal generation circuit C1 maintains the control signal S1 at the "H" level until the time point t17.

Next, the signal generation circuit C1 changes the write DQS-output enable signal (the control signal S2) from the "L" level to the "H" level at the time point t11, and maintains the "H" level until the time point t16. That is, by causing the control signal S2 to be in the negate state, it is possible to suppress signals from being output from the first input/output circuit 41. Thereby, the first input/output circuit 41 is able to receive the read DQS.

Next, the signal generation circuit C1 changes the REB data input to the second signal line 30*b* from the "H" level to the "L" level at time point t12. Thereby, the NAND device 20 is notified that the memory controller 10 is in a ready state for the read operation. The first multiplexer 32 connects the second signal line 30*b* to the first timing logic 33 in the case where the data read operation is performed. Thereby, the REB data input to the second signal line 30*b* passes through the first multiplexer 32 and is input to the first timing logic circuit 33. From the time point t13 to the time point t14, the first timing logic circuit 33 generates the source signal RESS, which is a toggle signal, based on the input REB data and the operation clock CLK, and inputs the generated source signal RESS to the first delay circuit 34.

An amount of delay of the source signal RESS from the first timing logic circuit 33 is adjusted by the first delay circuit 34. And, a duty ratio of the source signal RESS is adjusted by the first DCA circuit 35. The third multiplexer 37 connects the first DCA circuit 35 to the second input/output circuit 42 in the case where the data read operation is performed. Thereby, the source signal RESS that has passed through the first DCA circuit 35 is input to the second input/output circuit 42 via the third multiplexer 37. Thereby, the source signal RESS input to the second input/output circuit 42 is output from the second terminal 42*p* to the NAND device 20.

In response to this operation, the NAND device 20 outputs the read DQS to the first terminal 41*p* of the NAND Phy 30 and outputs the read DQ to the third terminal 54*p* of the NAND Phy 30. As shown in FIG. 6, the read DQS is a signal delayed from the source signal RESS. The first input/output circuit 41 outputs, to the signal receiving circuit C2, the read DQS input to the first terminal 41*p*. The third input/output circuit 54 outputs, to the signal receiving circuit C2, the read DQ input to the third terminal 54*p*. The signal receiving circuit C2 reads read data based on the input read DQ and the input read DQS.

After that, the signal generation circuit C1 changes the REB data input to the second signal line 30*b* from the "L" level to the "H" level at the time point t15. In response to this operation, the read DQS is changed from the "L" level to the "H" level. Thereby, the output operation of signals from the NAND Phy 30 for reading of data ends.

The signal generation circuit C1 maintains the write DQS data input to the first signal line 30*a* at the "H" level in the case where the data read operation described above is performed. In the embodiment, the first signal line 30*a* is disconnected from the first timing logic circuit 33 by the first multiplexer 32 in the case where the data read operation is performed. Therefore, the write DQS data input to the first signal line 30*a* is not input to the first timing logic circuit 33.

4. Advantage

According to this configuration, it is possible to provide a semiconductor integrated circuit that is able to be downsized and reduce power consumption. Here, as a comparative example, a semiconductor integrated circuit in which a DQS output circuit that generates and outputs a write DQS based on write DQS data, and a REB output circuit that generates and outputs a read enable signal (REB) including a source signal RESS are provided independently is considered. In this case, each of the DQS output circuit and the REB output circuit has a timing logic circuit and/or a DCA circuit although they are used exclusively. Each of the timing logic circuit and the DCA circuit is composed of a plurality of elements, and has a required relatively large circuit area and a relatively large leak current as compared with other circuits. Therefore, in the case where the timing logic circuit and/or the DCA circuit is provided in each of the DQS output circuit and the REB output circuit, the semiconductor integrated circuit is likely to be large in size and the power consumption is likely to be large.

On the other hand, in the embodiment, by providing a switch circuit, the DQS output circuit and the REB output circuit are able to share one or more circuits. For example, in the embodiment, the DQS output circuit and the REB output circuit shares a timing logic circuit and/or a DCA circuit which have relatively large area. As a result, a circuit area and a leakage current can be reduced. Further, the number of flip-flop circuits (for example, the number of flop-flop circuits in the timing logic circuit) is also reduced in accordance with the reduction in circuit scale. Therefore, the number of clock trees may be reduced. As a result, the clock trees may be optimized, and power reduction of the clock trees may be expected. Therefore, the semiconductor integrated circuit may be downsized and the power consumption may be reduced.

Some modifications of the embodiment will be described below.

(First Modification)

Figure 7:
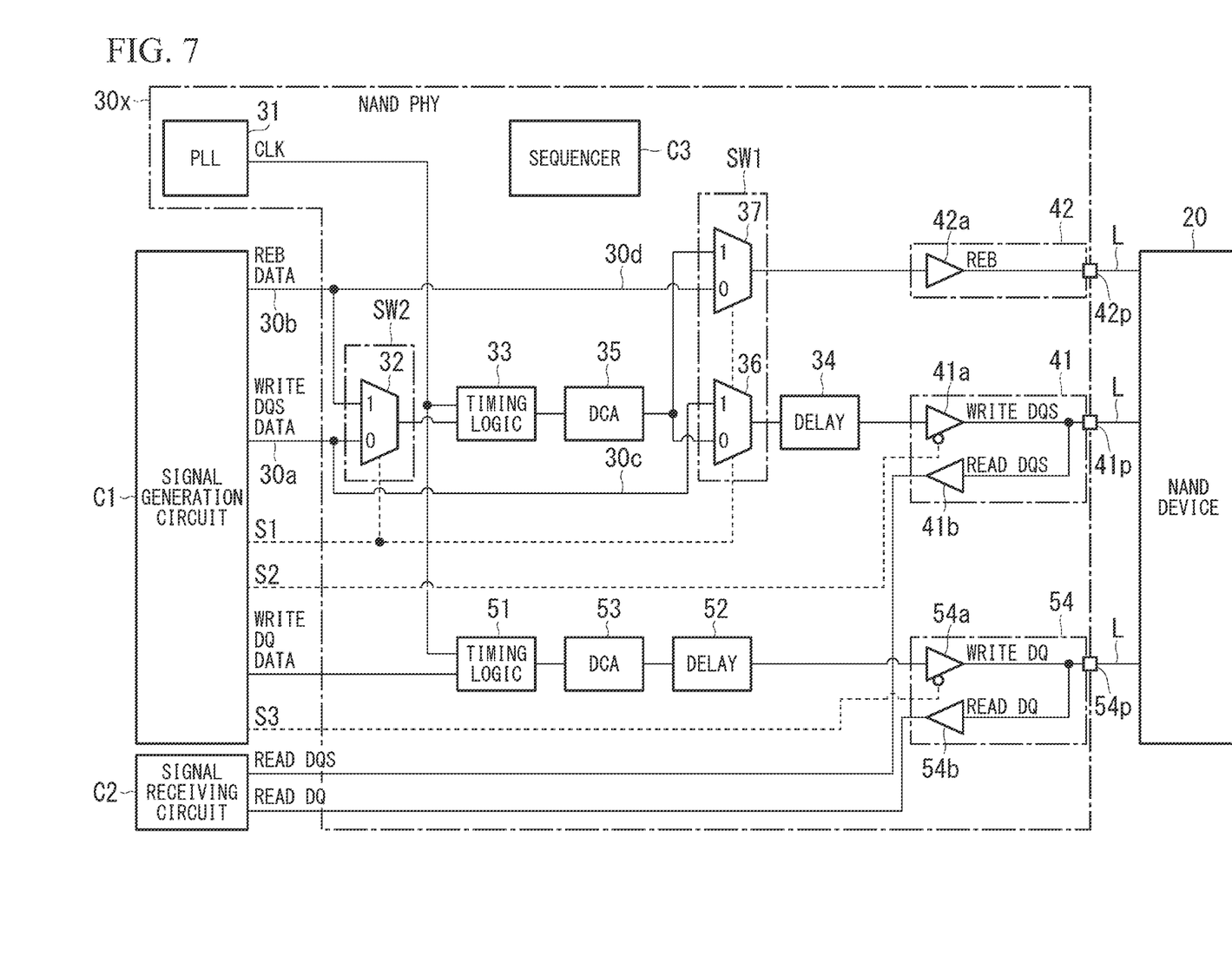
FIG. 7 is a block diagram showing a configuration of a NAND Phy in a first modification of the embodiment.

FIG. 7 is a block diagram showing a configuration of a NAND Phy 30*x* of a first modification. As shown in FIG. 7, the first delay circuit 34 is provided between the second multiplexer 36 (the switch circuit SW1) and the first input/ output circuit 41 instead of between the first timing logic circuit 33 and the first DCA circuit 35. This is because the source signal RESS is not a strobe signal and is used as an operation clock in the NAND device 20. That is, the delay amount of the source signal RESS may not need to be adjusted in some cases. In this modification, the first timing logic circuit 33 and the first DCA circuit 35 constitute an example of "third circuit." However, as described above, the third circuit may be constituted of only one of the first timing logic circuit 33 and the first DCA circuit 35.

(Second Modification)

Figure 8:
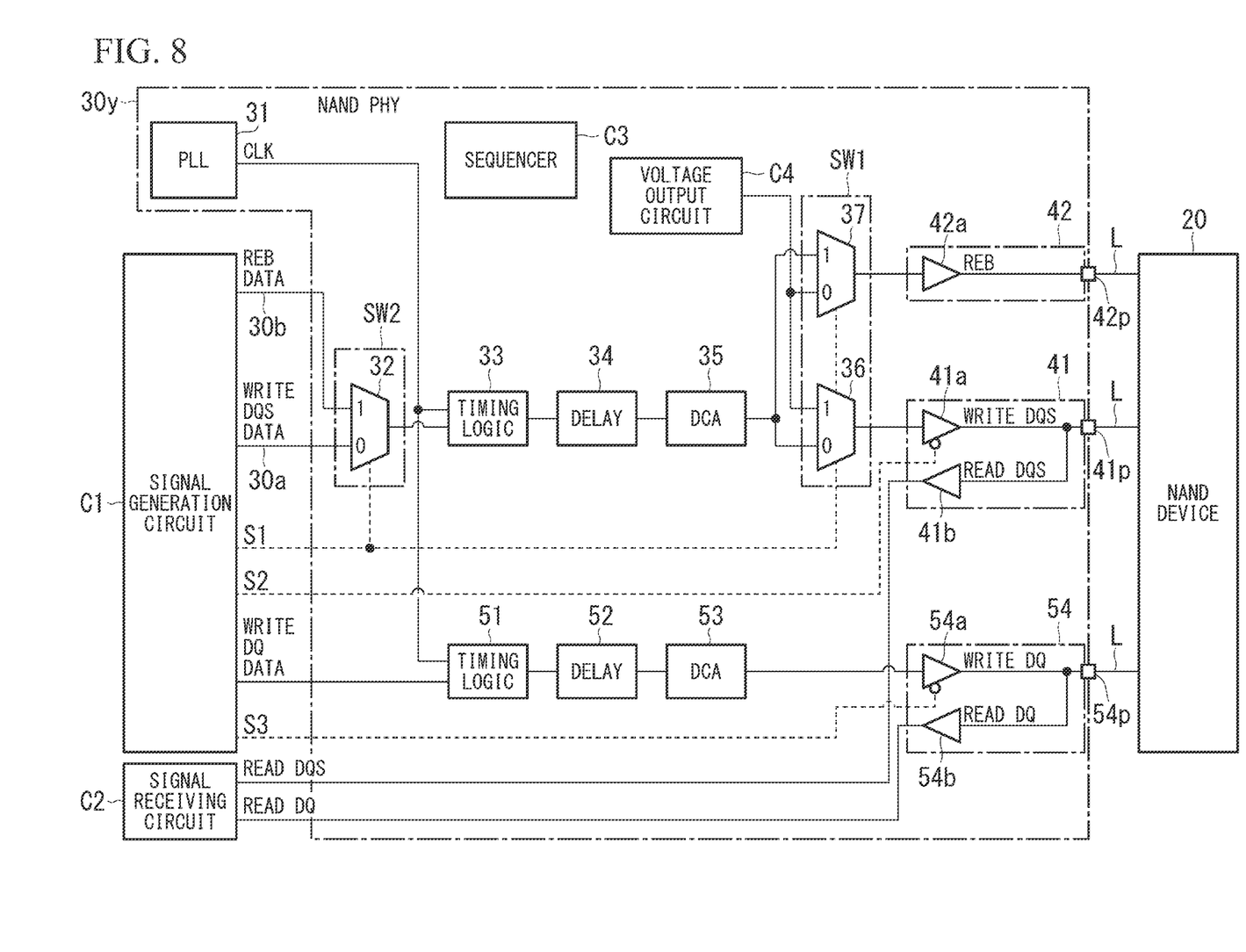
FIG. 8 is a block diagram showing a configuration of a NAND Phy in a second modification of the embodiment.

FIG. 8 is a block diagram showing a configuration of a NAND Phy 30*y* of the second modification. As shown in FIG. 8, the NAND Phy 30*y* may have a voltage output circuit C4 instead of the first bypass signal path 30*c* and the second bypass signal line 30*d*. For example, the voltage output circuit C4 is connected to the second input terminal of the second multiplexer 36 and the first input terminal of the third multiplexer 37. The voltage output circuit C4 inputs a signal fixed at the "H" level to the second input terminal of the second multiplexer 36 and the first input terminal of the third multiplexer 37. The signal fixed to the "H" level is, for example, a signal corresponding to the negate state of the read enable signal (REB). The signal fixed at the "H" level is an example of the "sixth signal." The third multiplexer 37 inputs the signal fixed at the "H" level to the second input/output circuit 42 in the case where the data write operation to the NAND device 20 is performed. In this case, the second input/output circuit 42 outputs the signal input from the third multiplexer 37 to the NAND device 20. With such a configuration, it is possible to realize the same function as that of the above embodiment.

(Third Modification)

Figure 9:
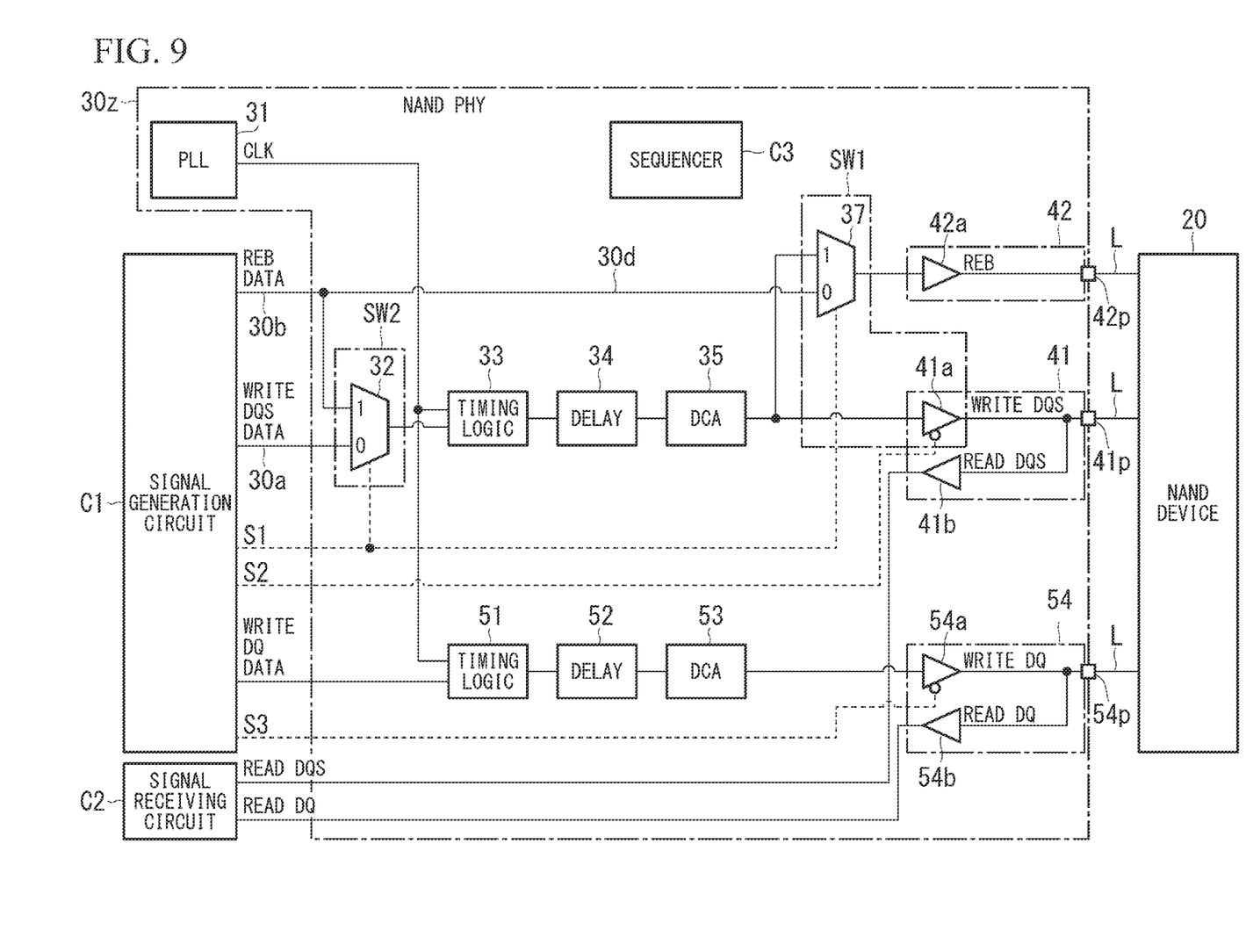
FIG. 9 is a block diagram showing a configuration of a NAND Phy in a third modification of the embodiment.

FIG. 9 is a block diagram showing a configuration of a NAND Phy 30*z* of the third modification. As shown in FIG. 9, the second multiplexer 36 and the first bypass signal path 30*c* may be omitted. In this case, an example of a "first switch circuit SW1" is constituted by the third multiplexer 37 and the driver 41*a* of the first input/output circuit 41, and part of the first input/output circuit 41 excluding the driver 41*a* is one example of a "first circuit." In this case, a connection state between the first DCA circuit 35 and the first circuit is switched based on a state of the write DQS-output enable signal (the control signal S2) for the driver 41*a* of the first input/output circuit 41. With such a configuration, it is possible to realize the same function as that of the above embodiment.

An embodiment and some modifications have been described above. However, embodiments are not limited to the above examples. For example, one or more of the first to third multiplexers 32, 36, and 37 are replaced with a circuit having the same or similar function composed of a plurality of circuit elements (for example, NAND logic gate circuit) instead of the multiplexer circuit. The NAND Phys 30, 30*x*, 30*y*, and 30*z* may have an equivalent delay circuit instead of the second DCA circuit 53. The first DCA circuit 35 and the second DCA circuit 53 may be omitted, and only s delay control function by the first delay circuit 34 and the second delay circuit 52 may be implemented.

According to one embodiment described above, a semiconductor integrated circuit includes a switch circuit configured to connect a third circuit to a first circuit in a case where a first signal is output from the first circuit to an outside, and configured to connect the third circuit to a second circuit in a case where a second signal is output from the second circuit to the outside, the second signal being different from the first signal. According to such a configuration, the semiconductor integrated circuit may be downsized.

Hereinafter, some semiconductor integrated circuits will be described.

[1] A semiconductor integrated circuit comprising:
a first circuit;
a second circuit different from the first circuit;
a third circuit configured to adjust a timing of an edge of a signal; and
a first switch circuit configured to connect the third circuit to the first circuit in a case where a first operation in which a first signal corresponding to first data is output from the first circuit to an outside is performed, and configured to connect the third circuit to the second circuit in a case where second operation in which a second signal is output from the second circuit to the outside for receiving second data from the outside is performed, the second signal being different from the first signal.

[2] The semiconductor integrated circuit according to [1], wherein
the first signal includes a first toggle signal, and
the second signal includes a second toggle signal.

[3] The semiconductor integrated circuit according to [1], further comprising:
a first signal line to which a third signal is input;
a second signal line to which a fourth signal is input; and
a second switch circuit configured to connect the first signal line to the third circuit in the case where the first operation is performed, and configured to connect the second signal line to the third circuit in the case where the second operation is performed.

[4] The semiconductor integrated circuit according to [3], wherein
the first switching circuit outputs, to the second circuit, a fourth signal that is input to the first switching circuit from the second signal line in the case where the first operation is performed.

[5] The semiconductor integrated circuit according to [4], wherein
the second signal is changed between a first voltage level and a second voltage level, and becomes the first voltage level at least at a timing in the case where the second operation is performed, and
the first switching circuit outputs the fourth signal at the second voltage level to the second circuit in the case where the first operation is performed.

[6] The semiconductor integrated circuit according to [1], further comprising
a receiving circuit configured to connected to the first circuit.
wherein the first circuit outputs a strobe signal to the receiving circuit in the case where the second operation is performed, the strobe signal being for the second data and being received from the outside.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
a first circuit configured to output a first signal;
a second circuit configured to output a second signal different from the first signal;
a third circuit configured to output a third signal corresponding to either the first signal or the second signal; and
a first switch circuit configured to output the third signal to the first circuit in a case that the first circuit outputs the first signal, the first switch circuit being configured to output the third signal to the second circuit in a case that the second circuit outputs the second signal.

2. The semiconductor integrated circuit according to claim 1, further comprising:
a first signal line which transmits a fourth signal corresponding to the first signal;
a second signal line which transmits a fifth signal corresponding to the second signal; and
a second switch circuit configured to output the fourth signal to the third circuit in a case that the first circuit outputs the first signal, the second switch circuit being configured to output the fifth signal to the third circuit in a case that the second circuit outputs the second signal.

3. The semiconductor integrated circuit according to claim 2, wherein
the first switch circuit includes a first multiplexer and a second multiplexer,
the first multiplexer is configured to output the third signal to the first circuit in a case that the first circuit outputs the first signal,
the first multiplexer is configured to output the fourth signal to the first circuit in a case that the second circuit outputs the second signal,
the second multiplexer is configured to output the fifth signal to the second circuit in a case that the first circuit outputs the first signal, and
the second multiplexer is configured to output the third signal to the second circuit in a case that the second circuit outputs the second signal.

4. The semiconductor integrated circuit according to claim 1, wherein
the third circuit includes a circuit that adjusts a duty ratio of a sixth signal to be inputted to the third circuit.

5. The semiconductor integrated circuit according to claim 4, wherein
the third circuit further includes a circuit configured to generate a seventh signal, and
the seventh signal synchronizes with an input clock signal.

6. The semiconductor integrated circuit according to claim 5, wherein
the seventh signal is the sixth signal, and
the sixth signal is input to the circuit that adjusts a duty ratio.

7. The semiconductor integrated circuit according to claim 5, wherein
the third circuit further includes a circuit configured to delay an eighth signal to be inputted to the third circuit.

8. The semiconductor integrated circuit according to claim 7, wherein
the eighth signal is the seventh signal.

9. A memory controller comprising:
the semiconductor integrated circuit according to claim 1; and
a signal generation circuit configured to output a control signal which controls the first switch circuit.

10. The memory controller according to claim 9, wherein the semiconductor integrated circuit comprises:
a first signal line which transmits a fourth signal corresponding to the first signal;
a second signal line which transmits a fifth signal corresponding to the second signal; and
a second switch circuit configured to output the fourth signal to the third circuit in a case that the first circuit outputs the first signal, the second switch circuit being configured to output the fifth signal to the third circuit in a case that the second circuit outputs the second signal.

11. The memory controller according to claim 10, wherein in the semiconductor integrated circuit:
the first switch circuit includes a first multiplexer and a second multiplexer,
the first multiplexer is configured to output the third signal to the first circuit in a case that the first circuit outputs the first signal, and the first multiplexer is configured to output the fourth signal to the first circuit in a case that the second circuit outputs the second signal, and
the second multiplexer is configured to output the fifth signal to the second circuit in a case that the first circuit outputs the first signal, and the second multiplexer is configured to output the third signal to the second circuit in a case that the second circuit outputs the second signal.

12. The memory controller according to claim 9, wherein in the semiconductor integrated circuit,
the third circuit includes a circuit that adjusts a duty ratio of a sixth signal to be inputted to the third circuit.

13. The memory controller according to claim 12, wherein
in the semiconductor integrated circuit,
the third circuit further includes a circuit configured to generate a seventh signal that synchronizes with an input clock signal.

14. The memory controller according to claim 13, wherein
in the semiconductor integrated circuit,
the third circuit further includes a circuit configured to delay an eighth signal to be inputted to the third circuit.

15. A memory system comprising:
a semiconductor memory device; and
the memory controller according to claim 9, wherein the memory controller includes:
a first terminal connecting the first circuit and the semiconductor memory device; and
a second terminal connecting the second circuit and the semiconductor memory device.

16. The memory system according to claim 15, wherein the semiconductor integrated circuit comprises:
a first signal line which transmits a fourth signal corresponding to the first signal;
a second signal line which transmits a fifth signal corresponding to the second signal; and
a second switch circuit configured to output the fourth signal to the third circuit in a case that the first circuit outputs the first signal, the second switch circuit being configured to output the fifth signal to the third circuit in a case that the second circuit outputs the second signal.

17. The memory system according to claim 16, wherein in the semiconductor integrated circuit:
the first switch circuit includes a first multiplexer and a second multiplexer, wherein
the first multiplexer is configured to output the third signal to the first circuit in a case that the first circuit outputs the first signal, and the first multiplexer is configured to output the fourth signal to the first circuit in a case that the second circuit outputs the second signal, and
the second multiplexer is configured to output the fifth signal to the second circuit in a case that the first circuit outputs the first signal, and the second multiplexer is configured to output the third signal to the second circuit in a case that the second circuit outputs the second signal.

18. The memory system according to claim 15, wherein in the semiconductor integrated circuit,
the third circuit includes a circuit that adjusts a duty ratio of a sixth signal to be inputted to the third circuit.

19. The memory system according to claim 18, wherein in the semiconductor integrated circuit,
the third circuit further includes a circuit configured to generate a seventh signal, and
the seventh signal synchronizes with an input clock signal.

20. The memory system according to claim 19, wherein in the semiconductor integrated circuit,
the third circuit further includes a circuit configured to delay an eighth signal to be inputted to the third circuit.

* * * * *